United States Patent [19]
Soeno et al.

[11] Patent Number: 5,397,998
[45] Date of Patent: Mar. 14, 1995

[54] BURN-IN APPARATUS

[75] Inventors: Shigeru Soeno; Hiroshi Oide, both of Kawasaki, Japan

[73] Assignee: Fujitsu Limited, Kawasaki, Japan

[21] Appl. No.: 916,270

[22] Filed: Jul. 21, 1992

[30] Foreign Application Priority Data

Jul. 22, 1991 [JP] Japan .................................. 3-205452

[51] Int. Cl.$^6$ ...................... B25J 21/00; G01R 31/28
[52] U.S. Cl. ...................................... 324/760; 340/652
[58] Field of Search ................ 73/865.6; 324/158 F, 324/501, 502, 511, 537, 555, 556, 750, 760; 340/635, 640, 641, 642, 652, 653; 374/45, 57; 414/148, 152, 153, 222, 223; 198/339.1, 340, 341, 346, 346.1, 346.2, 346.3; 29/404, 405; 445/6

[56] References Cited

U.S. PATENT DOCUMENTS

| | | | |
|---|---|---|---|
| 3,408,565 | 10/1968 | Frick et al. ...................... | 324/158 F |
| 4,145,620 | 3/1979 | Dice ................................ | 324/501 X |
| 4,636,726 | 1/1987 | Santomango et al. ........... | 324/158 F |
| 4,745,354 | 5/1988 | Fraser ........................... | 324/158 F X |
| 4,871,963 | 10/1989 | Cozzi ............................. | 324/158 F X |
| 4,881,591 | 11/1989 | Rignall .......................... | 324/158 F X |
| 4,949,035 | 8/1990 | Palmer, II ....................... | 324/158 R |
| 5,003,156 | 3/1991 | Kilpatrick et al. ........... | 324/158 F X |
| 5,021,732 | 6/1991 | Fuoco et al. .................. | 324/158 F |
| 5,093,982 | 3/1992 | Gussman ........................ | 324/158 F X |
| 5,126,656 | 6/1992 | Jones ............................. | 324/158 F |

FOREIGN PATENT DOCUMENTS

| | | | |
|---|---|---|---|
| 184872 | 10/1984 | Japan .............................. | 324/158 F |
| 2176 | 1/1987 | Japan .............................. | 324/158 F |
| 66567 | 3/1989 | Japan .............................. | 324/158 F |
| 179139 | 6/1992 | Japan .............................. | 324/158 F |
| 477566 | 11/1975 | U.S.S.R. ......................... | 324/158 F |

OTHER PUBLICATIONS

*IBM Technical Disclosure Bulletin*: vol. 9, No. 3 Aug. 1966, pp. 240-241, "Test Component Handler", by S. I. Bruder et al; vol. 14, No. 4, Sep. 1971 p. 1035, Pallet Transport and Conditioner, by B. C. Ruse et al; and vol. 20, No. 5, Oct. 1977 pp. 1837-1838, Environment Test Chamber for Circuit Card, by J. S. Hanson (all 3 references found in 324/158 F).

*Primary Examiner*—Tom Noland
*Attorney, Agent, or Firm*—Staas & Halsey

[57] ABSTRACT

A burn-in apparatus wherein products can be checked during burn-in to determine whether or not a respective product will fail completely during burn-in or whether the product will operate unstably during burn-in. The burn-in apparatus includes a burn-in chamber which burns in a product placed therein. A product carry-in automatic conveyer carries products into the burn-in chamber and a product carry-out automatic conveyor carries products out of the burn-in chamber. An air conditioning unit adjusts the temperature of air inside the burn-in chamber. A product testing section, extending between the outside and the inside of the burn-in chamber, holds and provides electrical power to a product during burn in. Testing equipment is provided outside the burn-in chamber and connects to a product held by the product testing section so that the product can be tested during burn in. A burn-in storage, provided inside said burn-in chamber, receives a product and provides electrical power thereto until the product is to be tested. A product moving mechanism transports a product to be tested from the burn-in storage to the product testing section and automatically moves a product among the product carry-in automatic conveyor, the product carry-out automatic conveyor, the burn-in storage and the product testing section.

32 Claims, 13 Drawing Sheets

FIG. I
PRIOR ART

BURN-IN APPARATUS

BACKGROUND OF THE INVENTION

This invention relates to a burn-in apparatus.

Makers are required to find out, before shipment of products from a factory, initial failures of the products which may occur within one or two years after they have been delivered to and installed at a customer. To this end, burn-in apparatus have been developed wherein a product is heated for a fixed period of time in an energized condition and it is checked by various testing equipment to see whether or not a failure occurs.

FIG. 1 is a perspective view showing a conventional individual burn-in apparatus. Referring to FIG. 1, the conventional individual burn-in apparatus shown includes a testing equipment 4, an air conditioning unit 7, a connecting cable 11 and an individual burn-in chamber 200. The individual burn-in chamber 200 has a doorway 201 and includes a feeder apparatus 202.

The air conditioning unit 7 conditions air in the individual burn-in chamber 200 to a temperature suitable for a product to be tested.

The connecting cable 11 interconnects the testing equipment 4 and a product accommodated in the burn-in chamber 200, and the testing equipment 4 performs testing of the product to determine whether or not the product has something wrong. The testing equipment 4, however, does not perform all tests for the product, but performs only some required abridged tests (whether or not a self-diagnosis function, a voltage and so forth are normal).

The individual burn-in chamber 200 accommodates fixedly therein a product to be tested for a fixed period of time. The temperature of air in the individual burn-in chamber 200 is adjusted and maintained, controlled by the air conditioning unit 7, to a temperature suitable for a product to be tested so that the product accommodated in the individual burn-in apparatus 200 is heated to perform burn-in thereof while a testing operation is performed by the testing equipment 4.

The doorway 201 of the individual burn-in chamber 200 has a door provided therefor, and the door is opened only when a product is carried into or out from the individual burn-in chamber 200. The feeder apparatus 202 is accommodated fixedly in the individual burn-in chamber 200 and supplies electric power to a product to be burned in so as to keep the product in an energized condition during burning-in.

With the burn-in apparatus, a product for an object of testing is first carried into the individual burn-in chamber 200 by way of the doorway 201 the door of which is open, and is fixed in the individual burn-in chamber 200, and then, the door is closed. After then, the temperature of air in the individual burn-in chamber 200 is adjusted to a temperature suitable for testing by means of the air conditioning unit 7.

Then, the product fixedly accommodated in the individual burn-in apparatus 200 is supplied with electric power by the feeder apparatus 202 disposed in the individual burn-in chamber 200 so that it is thereafter kept in an energized condition.

Further, the product accommodated in the individual burn-in chamber 200 is heated by the air, which is kept conditioned to the temperature suitable for testing of the product in the individual burn-in chamber 200, so that it may be burned in. The product is connected to the testing equipment 4 by way of the connecting cable 11.

After then, while the product is burned in in the individual burn-in chamber 200, only some required abridged tests are performed by the testing equipment 4 to check whether or not the product has some defect.

FIG. 2 is a perspective view showing a conventional unmanned burn-in apparatus of the conveyor type. Referring to FIG. 2, the unmanned burn-in apparatus shown includes a testing equipment 4, three air conditioning units 7, a connecting cable 11 and a burn-in chamber 210. The burn-in chamber 210 has an entrance 212 and an exit 213 for a product at opposing portions thereof, and the unmanned burn-in apparatus of the conveyor type further includes an automatic conveyor 211 extending through the burn-in chamber 210 between and farther than the entrance 212 and the exit 213. The automatic conveyor 211 includes several feeder apparatus 214.

Here, the testing equipment 4, the air conditioning units 7 and the connecting cable 11 are individually constructed substantially similarly to those of the individual burn-in apparatus of FIG. 1 described above.

The burn-in chamber 210 accommodates therein a product to be burned in, and the temperature of air in the burn-in chamber 210 is adjusted and maintained adjusted by the air conditioning unit 7 to a temperature suitable for a product to be tested so that the product accommodated in the burn-in chamber 210 is heated to perform burn-in thereof.

The entrance 212 has a door provided therefor, and the door is opened only when a product is carried into the burn-in chamber 210. Also, the exit 213 has a door provided therefor, and the door is opened only when a product is carried out from the burn-in chamber 210.

The automatic conveyor 211 carries products successively into the burn-in chamber 210 by way of the entrance 212 and dynamically moves the products in the burn-in chamber 210 from the entrance 212 to the exit 213 of the burn-in chamber 210. The automatic conveyor 211 then feeds the products successively to the testing equipment 4 by way of the exit 213 of the burn-in chamber 210.

The feeder apparatus 214 supply electric power to products to be burned in which are placed on the automatic conveyor 211 and keep the products in an energized condition during burning in.

With the unmanned burn-in apparatus of the conveyor type, the air conditioning units 7 first conditions air in the burn-in chamber 210 to a temperature suitable for a product to be tested.

Then, products are successively accommodated into the burn-in chamber 210 from the entrance 212 side by the automatic conveyor 213 by way of the entrance 212, the door of which is open, and after such accommodation of the products is completed, the door is closed. Further, the products are individually supplied with electric power by the feeder apparatus 214.

In this instance, the products successively accommodated into the burn-in chamber 210 by the automatic conveyor 211 are heated by air, which is kept in the burn-in chamber 210 and conditioned to a temperature suitable for a product to be tested, so that they are burned in.

Then, after such burn-in, each of the products is carried out from the burn-in chamber 210 by the automatic conveyor 211 by way of the exit 213 of the burn-in chamber 210, the door of which is open, and after then, the door of the exit 213 is closed.

The product carried out from the burn-in chamber 210 in this manner is fed to the testing equipment 4 and then connected to the testing apparatus 4 by way of the connecting cable 11, whereafter only some required abridged tests are performed to check whether or not the product has some defects.

FIG. 3 is a perspective view showing a conventional unmanned burn-in apparatus of the horizontal circulating rack type. Referring to FIG. 3, the conventional unmanned burn-in apparatus of the horizontal circulating rack type includes a testing equipment 4, a connecting cable 11, three air conditioning units 7, a burn-in chamber 220, a lift apparatus 221 and an automatic conveyor 222. The burn-in chamber 220 has a doorway 223 and includes a burn-in storage 224 of the horizontal circulating rack type. The burn-in storage 224 of the horizontal circulating rack type includes a plurality of feeder apparatus 225.

Here, the testing equipment 4, the connecting cable 11 and the air conditioning units 7 are constructed substantially similarly to those of the burn-in apparatus of FIG. 2, and the automatic conveyor 222 successively transports products to the lift apparatus 221 and further transports products placed thereon by the lift apparatus 221 to the testing equipment 4.

The lift apparatus 221 moves upwardly or downwardly and takes out a product from the automatic conveyor 222 or from one of racks of the burn-in storage 224 of the horizontal circulating rack type, carries the thus taken out product upwardly or downwardly and places or accommodates the product onto the automatic conveyor 222 or one of the racks of the burn-in storage 224 of the horizontal circulating rack type.

The burn-in chamber 220 maintains the temperature of air in the burn-in chamber 220 which is conditioned to a temperature suitable for a product to be tested by the air conditioning unit 7 so as to heat products placed on the racks of the burn-in storage 224 of the horizontal circulating rack type in the burn-in chamber 220. Meanwhile, the doorway 223 has a door provided therefor, and the door is opened only when a product is to be carried into or out from the burn-in chamber 220.

The burn-in storage 224 of the horizontal circulating rack type literally is a horizontally circulating rack arrangement having a plurality of racks disposed in three horizontal rows on which products are to be placed and energized. The racks are disposed along a circular path and circulated horizontally on the circular path thereby so that a required rack may be transported to the doorway 223 of the burn-in chamber 220.

A feeder apparatus 225 is provided for each of the racks of the burn-in storage 224 of the horizontal circulating rack type and supplies electric power to a product placed on the corresponding rack of the burn-in storage 224 of the horizontal circulating rack type so as to keep the product in an energized condition during burning in.

With the unmanned burn-in apparatus of the horizontal circulating rack type, the air conditioning units 7 first condition air in the burn-in chamber 224 to a temperature suitable for a product to be tested.

Products are successively carried to a position in front of the lift apparatus 221 by the automatic conveyor 222, taken out from the automatic conveyor 222 by the lift apparatus 221, carried to a position in front of a selected one of the racks of the burn-in storage 224 of the horizontal circulating rack type by the lift apparatus 221, and placed onto the selected rack through the doorway 223 the door of which is open. After each product is placed onto such selected rack, the door of the doorway 223 is closed. Then, the product placed on the selected rack of the burn-in storage 224 of the horizontal circulating rack type is supplied with electric power from the corresponding feeder apparatus 225 so that it is thereafter kept in an energized condition.

In this manner, several products are placed onto selected racks of the burn-in storage 224 of the horizontal circulating rack type in the burn-in chamber 220 by the automatic conveyor 222 and the lift apparatus 221.

The products placed on the racks of the burn-in storage 224 of the horizontal circulating rack type in this manner are heated by air, which is maintained in the burn-in chamber 220 and conditioned to a temperature suitable for a product to be tested, while they are kept in an energized condition wherein they are supplied with electric power so that they may be burned in.

The products placed on the racks of the burn-in storage 224 of the horizontal circulating rack type after burn-in are successively carried to a position forwardly of the doorway 223 of the burn-in chamber 220 as the racks of the burn-in storage 224 are circulated horizontally. After then, the products are successively taken out from the burn-in storage 224 by the lift apparatus 221 through the doorway 223 the door of which is open, and then placed onto the automatic conveyor 222. After each product is placed on to the automatic conveyor 222, the door of the doorway 223 is closed.

Each of the products successively placed onto the automatic conveyor 222 in this manner are subsequently carried to the testing equipment 4 by the automatic conveyor 222 and connected to the testing equipment 4 by way of the connecting cable 11. After then, only some required abridged tests are performed by the testing equipment 4 to check whether or not the product has some defects.

The conventional burn-in apparatus described above with reference to FIGS. 1 to 3 have such several drawbacks as described below.

In particular, with the individual burn-in apparatus of FIG. 1, since a product is fixedly accommodated in the individual burn-in chamber and supplied with electric power and it is checked during burn-in of the product by the testing equipment whether or not the product has some defects, both of a product which fails completely during burn-in and another product which operates but unstably and suffers from a failure only during burn-in (making a factor of an initial failure after delivery to a customer) can be found out. However, since a set of testing equipments are required for a single product, a high cost of equipment is required.

Meanwhile, with the unmanned burn-in apparatus of-the conveyor type of FIG. 2 and the unmanned burn-in apparatus of the horizontal circulating rack type of FIG. 3, since burn-in of a large number of products can be performed by means of a burn-in chamber, the small number of air conditioning units and testing equipment is required. Also, burn-in can be performed in a high efficiency with regard to the quantity of products as compared to the individual burn-in apparatus and the cost of equipment required for inspection of telecommunication appliance products is much lower than that of the individual burn-in apparatus. However, since carrying of products into and out from the burn-in chamber is performed automatically, the automatic conveyor and the horizontal circulating racks operate every time, and consequently, the connecting cable for interconnecting products in the burn-in chamber and the testing equipment outside the burn-in chamber cannot be connected. As a result, presence or absence of defects cannot be checked by means of the testing equipment during burn-in.

Therefore, while a product which has failed completely during burn-in can be found out by a check of the testing equipment after completion of burn-in, a product which operates but unstably and suffers from a failure only when it is in a warm or heated condition during burn-in (making a factor of an initial failure after delivery to a customer) cannot be found out.

SUMMARY OF THE INVENTION

It is an object of the present invention to provide a burn-in apparatus wherein burn-in of a large number of products can be performed by means of a single burn-in chamber having a small number of air conditioning units and testing equipment so that a high efficiency with regard to quantity of products is achieved with a low cost of equipment, as compared with an individual burn-in apparatus.

It is another object of the present invention to provide a burn-in apparatus wherein products can be checked during burn-in thereof by means of a testing equipment to judge whether or not they have some defects to find products which have failed completely during burn-in and products which operate unstably and suffer from failures only during burn-in (making a factor of initial failures after delivery to a customer).

In order to attain the objects, according to the present invention, there is provided a burn-in apparatus comprising a burn-in chamber operatively connected to a product carry-in automatic conveyor and a product carry-out automatic conveyor for burning in a product having carried therein by the product carry-in automatic conveyor, the product after being burned in being carried out from the burn-in chamber by the product carry-out automatic conveyor, a testing equipment provided outside the burn-in chamber, an air conditioning unit provided outside the burn-in chamber for adjusting the temperature of air in the burn-in chamber, and a product testing section extending between the outside and the inside of the burn-in chamber for energizing a product during burning in in the burn-in chamber and testing the product using the testing equipment.

Preferably, the burn-in apparatus further comprises a burn-in storage provided in the burn-in chamber for receiving and energizing a product therein, and product moving means for moving a product among the product carry-in automatic conveyor, the product carry-out automatic conveyor, the burn-in storage and the product testing section.

The burn-in storage may include a plurality of racks each having a plurality of burn-in shelves and a plurality of corresponding feeder apparatus.

Preferably, the burn-in shelves of each of the racks are removably mounted on the rack so that the rack can receive a plurality of types of products having different profiles from each other.

The product moving means may include a lift apparatus movable upwardly or downwardly to take out a product from the product carry-in automatic conveyor, the burn-in storage or the product testing section, move the thus taken out product upwardly or downwardly and place or accommodate the product onto or into the product carry-out automatic conveyor the burn-in storage or the product testing section, and a moving apparatus for moving the lift apparatus along a transport passageway to a position in front of the product carry-in automatic conveyor, the product carry-out automatic conveyor, the burn-in storage or the product testing section.

Preferably, the product testing section comprises a glass closing window mounted for opening and closing motion on an outer wall of the burn-in chamber for allowing a product being burned in to be visually observed therethrough, an air shutter mounted on the outer wall of the burn-in chamber for blowing down a hot wind from above the glass closing window when the glass closing window is open to make a wall of warm air to prevent air in the burn-in chamber from leaking out to the outside of the burn-in chamber, a dynamic burn-in shelf provided in the burn-in chamber for receiving a product which is and is to be burned in in the burn-in chamber and undergoes testing by the testing equipment, a buffer burn-in rack for temporarily accommodating therein a product carried thereto by the product moving means or from the dynamic burn-in shelf, and a rack side conveyor for moving a product between the dynamic burn-in shelf and the buffer burn-in rack.

The dynamic burn-in shelf may comprise a cable detector for detecting connection or disconnection of a cable to the testing equipment, a stopper for stopping a product carried thereto by the rack side conveyor at a fixed position, and a feeder apparatus for energizing a product on the dynamic burn-in shelf.

The dynamic burn-in shelf may further comprise a chain conveyor for cooperating with the rack side conveyor to move a product.

Preferably, the chain conveyor is removably assembled to the product testing equipment.

The stopper may be contacted with a pallet, on which a product is placed, to stop the product at the fixed position.

Preferably, the dynamic burn-in shelf further comprises a pallet holder manually operable for holding down and fixing a pallet after the pallet is stopped by the stopper.

Preferably, the product testing section further comprises a product presence patrol light provided outside the burn-in chamber for indicating a condition of a product present in the product testing section.

Preferably, the burn-in apparatus further comprises burn-in controlling means for detecting, when there is an empty place in the product testing section, whether or not there is a product which can be carried out from the burn-in storage and executing, when such product exists, processing necessary for testing of a product to be performed at the product testing section, but ending processing when such product does not exist.

The burn-in controlling means may include product moving controlling means for moving a product.

Preferably, the product moving controlling means allows a product to be carried out from the burn-in storage within a fixed period of time after a scheduled point of time at which the product is to be carried out from the burn-in storage or after such scheduled point of time has passed.

The burn-in chamber may have an entrance having a door for permitting a product to be carried into the burn-in chamber by the product carry-in automatic conveyer, and an exit having a door for permitting a product to be carried out from the burn-in chamber by the product carry-out automatic conveyer.

Preferably, the burn-in apparatus further comprises a packing style detector for detecting data of a style of packing of a product carried out from the burn-in chamber by the product carry-out conveyer, the door of the entrance being opened when the packing style detector detects a product carried thereto.

In the burn-in apparatus, first, a product is carried into the burn-in chamber by the product carry-in automatic conveyer. Meanwhile, the air conditioning unit conditions air in the burn-in chamber to a temperature suitable for a product to be burned in, and the burn-in chamber maintains the temperature of air heated by the air conditioning unit in order to effect burn-in. Consequently, the product having been carried into the burn-in chamber by the product carry-in automatic conveyer is heated by the air in the burn-in chamber to burn in the product.

The product having been carried into the burn-in chamber by the product carry-in automatic conveyer is moved from the product carry-in automatic conveyer to the burn-in storage by the product moving means.

The product moved from the product carry-in automatic conveyer to the burn-in storage by the product moving means is energized in the burn-in storage.

One of products in the burn-in storage which is to be tested subsequently during burn-in is moved from the burn-in storage to the product testing section by the product moving means.

The product having been moved to the product testing section by the product moving means is energized by the product testing section while it is tested using the testing equipment during burn-in. The product for which the testing has been completed is moved from the product testing section to the burn-in storage or the product carry-out automatic conveyer by the product moving means.

The product for which the burn-in and the testing have been completed is moved from the burn-in storage or the product testing section to the product carry-out automatic conveyer by the product moving means.

After then, the product is carried out from the burn-in chamber.

In this manner, with the burn-in apparatus, a large number of products of different types can be burned in at a time by means of the single burn-in chamber, the air conditioning unit and the testing equipment. Consequently, the burn-in apparatus is advantageous in that it can effect burn-in of various products of various types at a high efficiency and the apparatus can be provided at a low cost of equipment comparing with an individual burn-in apparatus.

Further, since each of the racks has a plurality of burn-in shelves and a plurality of corresponding feeder apparatus and is constructed such that it can receive thereon a plurality of types of products having different profiles from each other, it can receive thereon and energize products of any of the different types.

Further, the product moving means can move, by means of the lift apparatus and the moving apparatus thereof, products among the product carry-in automatic conveyer, the product carry-out automatic conveyer, the burn-in storage and the product testing section.

Further, since the burn-in shelves of each of the racks are removably mounted on the rack, the distances between the turn-in shelves can be varied so that the rack can receive thereon a plurality of types of products having different profiles from each other.

Further, testing of a product can be performed by the testing equipment while it is being burned in by means of the chain conveyer, the cable detector, the stopper, the feeder apparatus and the pallet holder, and then the product can be moved to the rack side conveyer.

Furthermore, since the chain conveyer is removably assembled to the product testing equipment, an automatic cable connecting machine can be installed in place of the chain conveyer in the future.

Moreover, since the product presence patrol light is provided, a condition of a product present in the product testing section can be notified to the outside of the burn-in chamber.

Besides, dynamic burn-in of various products can be performed by means of the burn-in controlling apparatus and the product moving controlling means.

In addition, since the entrance having the door and the exit having the door are provided for the burn-in chamber and the packing style detector is provided, the door of the entrance is opened when the packing style detector detects a product carried thereto, and consequently, the product can be introduced into the burn-in chamber effectively.

Further objects, features and advantages of the present invention will become apparent from the following detailed description when read in conjunction with the accompanying drawings in which like parts or elements are denoted by like reference characters.

DESCRIPTION OF THE PREFERRED EMBODIMENT

Figure 1:
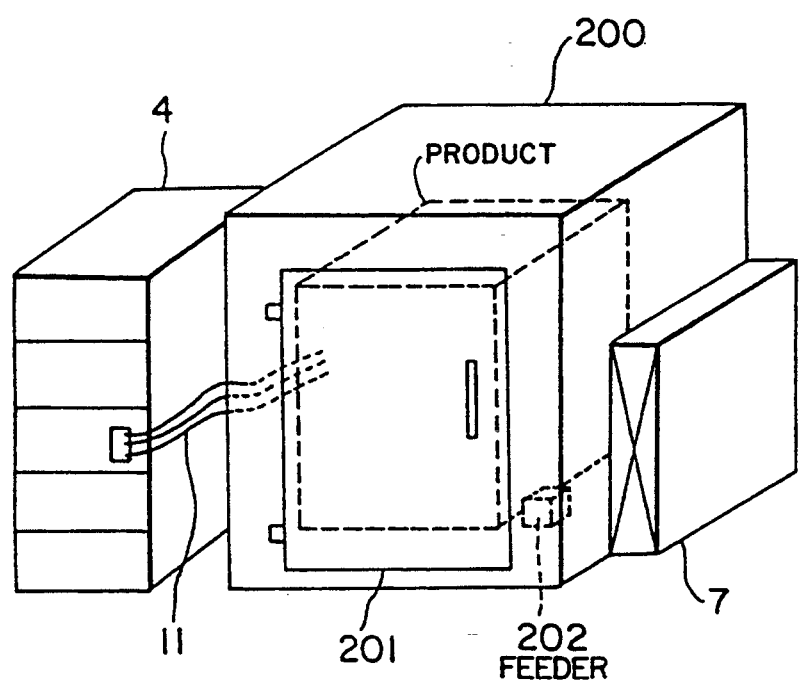
FIG. 1 is a perspective view showing a conventional individual burn-in apparatus.
Figure 2:
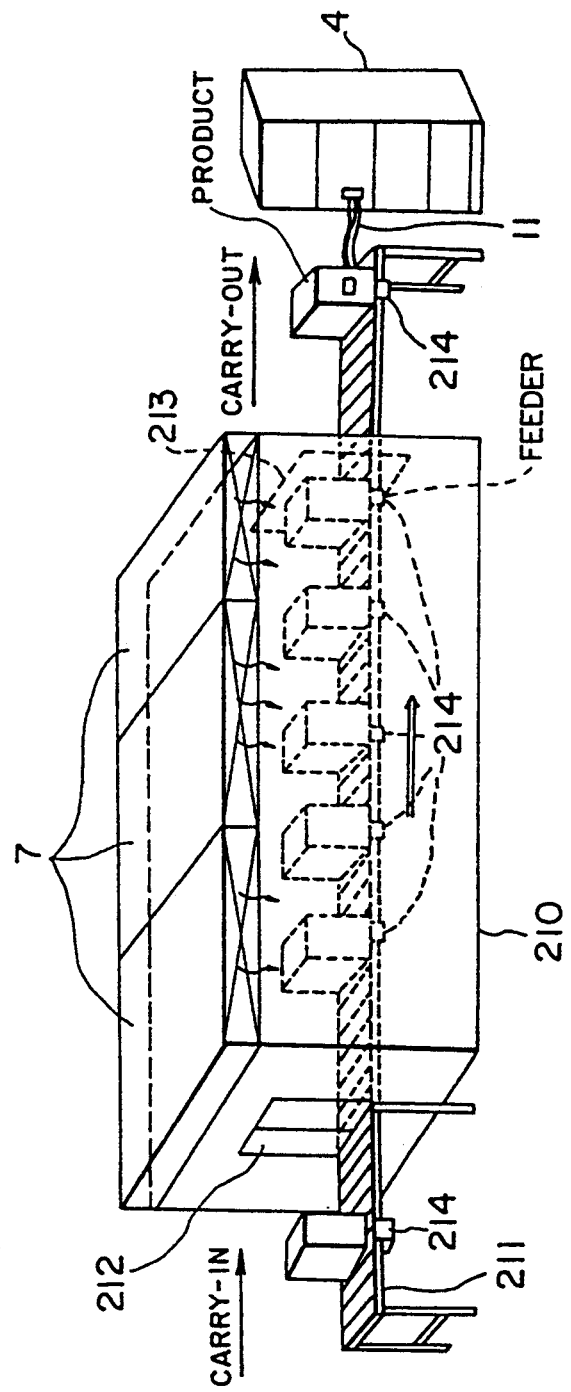
FIG. 2 is a perspective view showing a conventional unmanned burn-in apparatus of the conveyer type.
Figure 3:
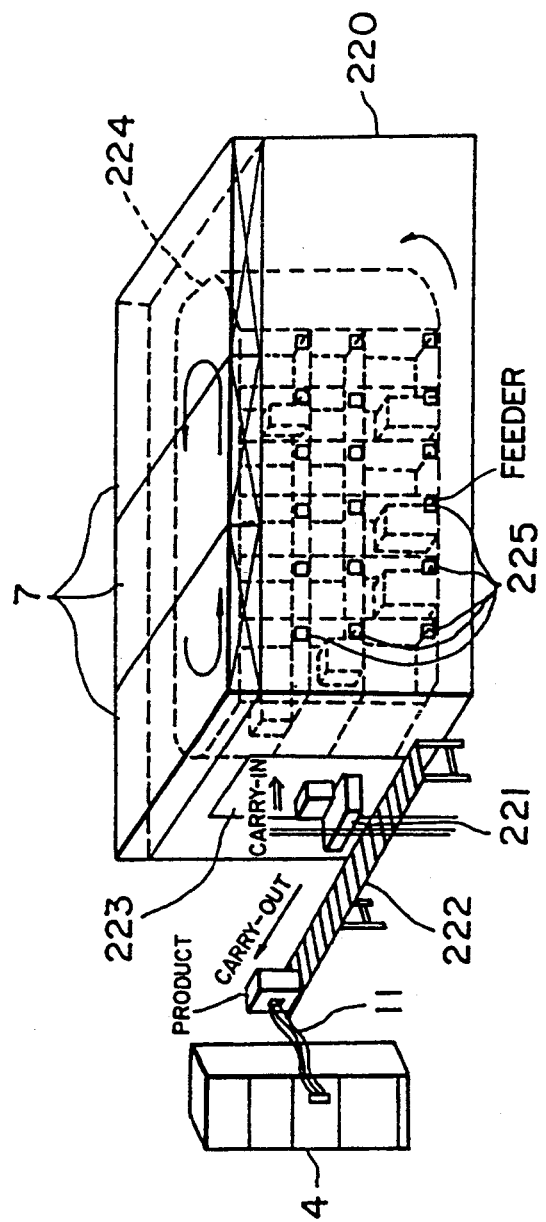
FIG. 3 is a perspective view showing a conventional unmanned burn-in apparatus of the horizontal circulating rack type.
Figure 4:
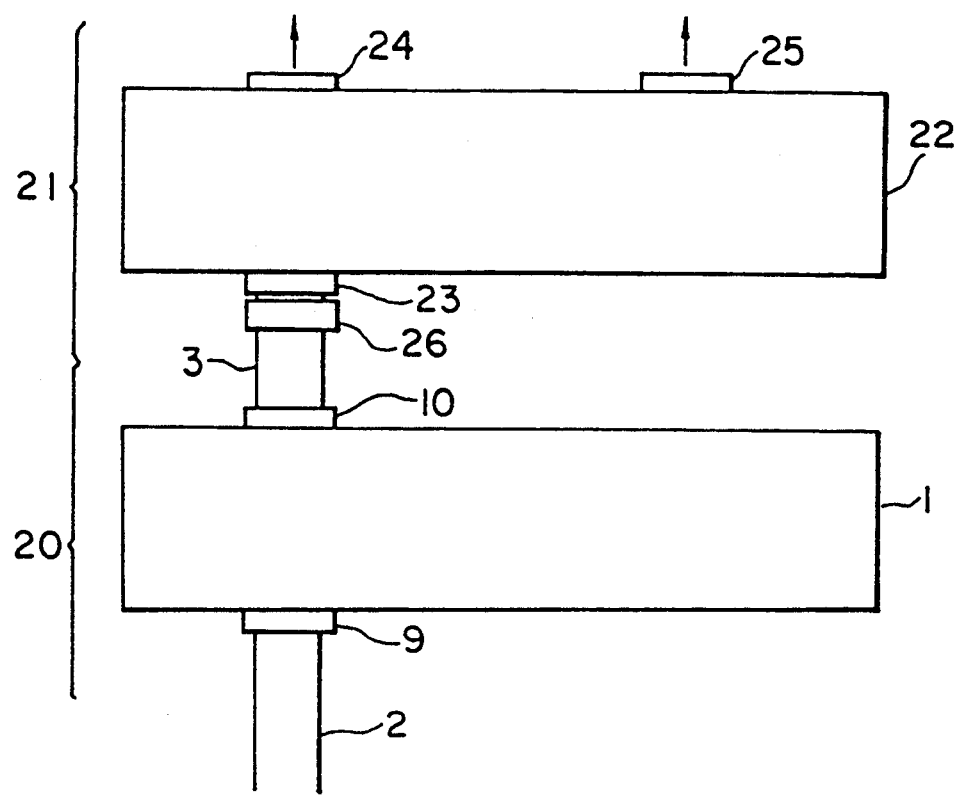
FIG. 4 is a diagrammatic view illustrating a positional relationship between a burn-in apparatus according to a preferred embodiment of the present invention and a cooling apparatus.
Figure 5:
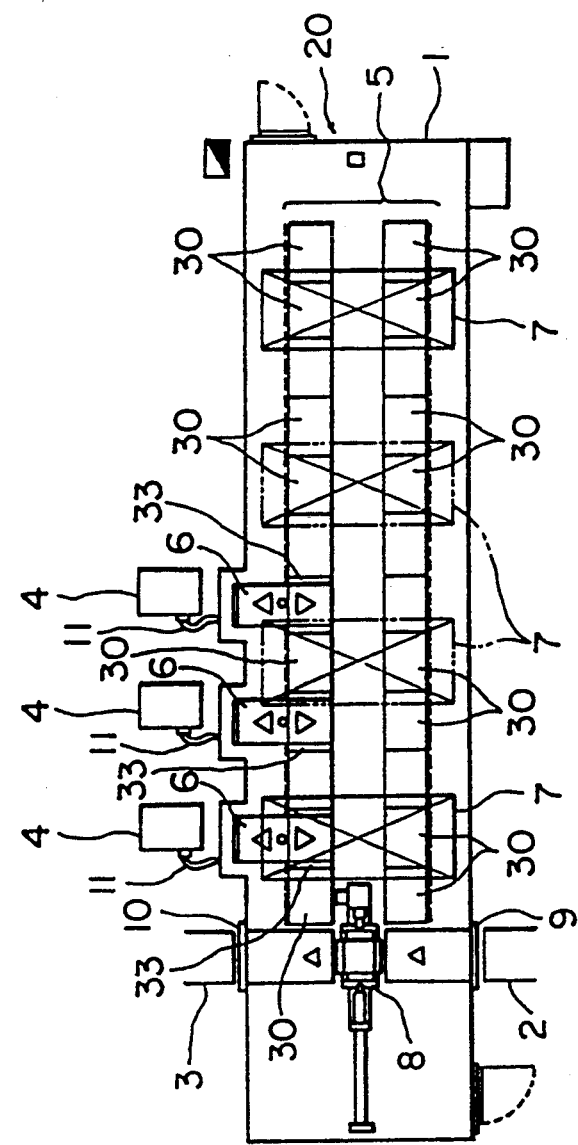
FIG. 5 is a schematic top plan view of the burn-in apparatus of FIG. 4.
Figure 6:
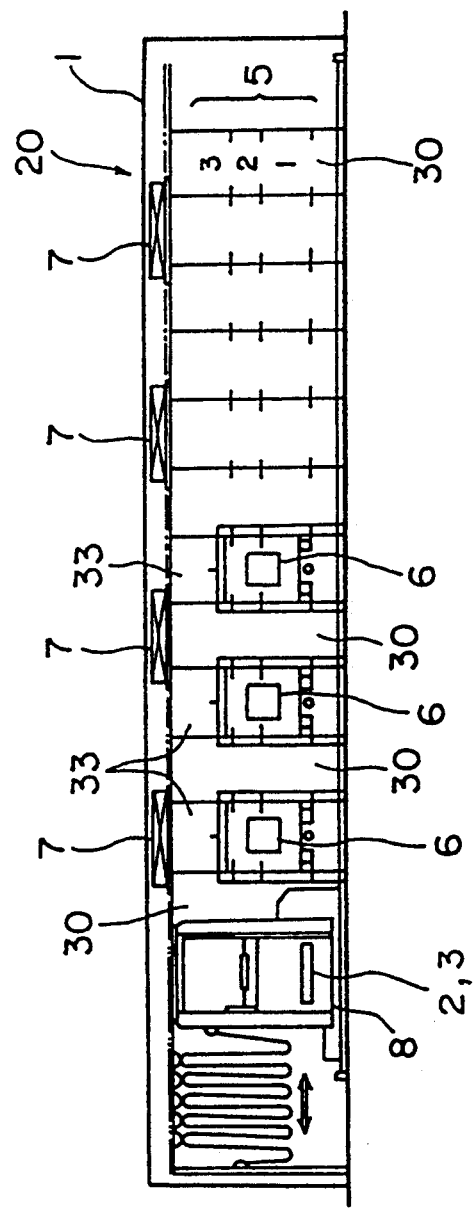
FIG. 6 is a schematic side elevational view of the burn-in apparatus of FIG. 4.
Figure 7:
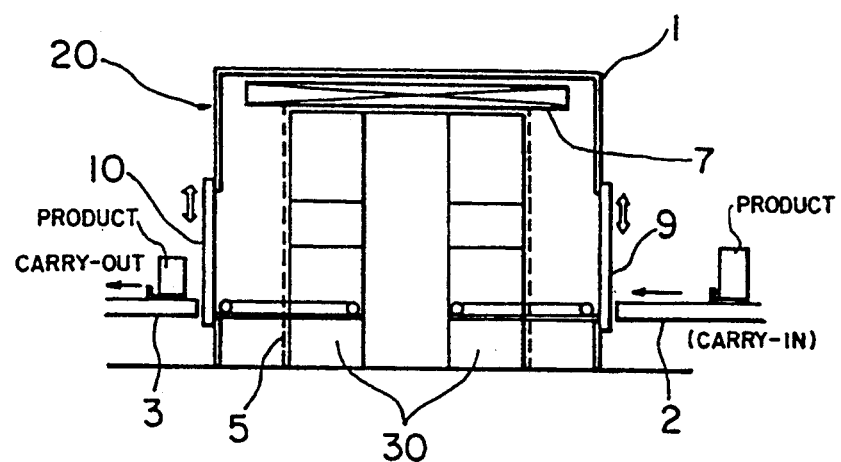
FIG. 7 is a sectional view of the burn-in apparatus of FIG. 4.
Figure 8:
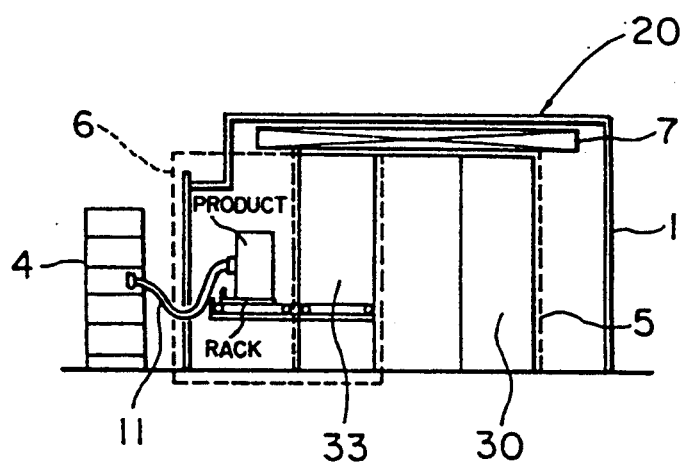
FIG. 8 is another sectional view of the burn-in apparatus of FIG. 4.

Referring first to FIG. 4, there is shown a positional relationship between a burn-in apparatus according to a preferred embodiment of the present invention and a cooling apparatus. A burn-in apparatus generally denoted at 20 includes a burn-in chamber 1 connected to a product carry-in automatic conveyor 2 and a product carry-out automatic conveyor 3. The burn-in chamber 1 is connected to a cooling chamber 22 of a cooling apparatus 21 by way of the product carry-out automatic conveyor 3.

The burn-in apparatus 20 accommodates therein products carried thereto by the product carry-in automatic conveyor 2 and tests the products while burning in them. The cooling apparatus 21 accommodates therein products carried thereto from the burn-in apparatus 1 by the product carry-out automatic conveyor 3 and cools them to a room temperature.

The burn-in apparatus 20 further includes an entrance 9 and an exit 10 connected to the burn-in chamber 1, and the cooling apparatus 21 further includes an entrance 23 and a pair of exits 24 and 25 connected to the cooling chamber 22, and a packing style detector 26.

The burn-in chamber 1 accommodates a plurality of products, which have been transported thereto by the product carry-in automatic conveyor 2, at predetermined positions therein, and testing of the products is performed in the burn-in chamber 1 while burn-in of the products is performed.

Products are carried into the burn-in chamber 1 by way of the entrance 9, and a door is provided for the entrance 9 and is opened only when a product is to be carried into the burn-in chamber 1. On the other hand, a product is carried out from the burn-in chamber 1 by way of the exit 10, and a door is provided also for the exit 10 and is opened only when a product is to be carried out from the burn-in chamber 1.

The cooling chamber 22 of the cooling apparatus 21 accommodates a plurality of products, which have been transported thereto by the product carry-out automatic conveyor 3, at predetermined positions therein and cools the products to a room temperature.

Products are carried into the cooling chamber 22 by way of the entrance 23, and a door is provided for the cooling chamber 22 and is opened only when a product is to be carried into the cooling chamber 22. Products are carried out from the cooling chamber 22 by way of the exits 24 and 25, and a door is provided for each of the exits 24 and 25 and is opened only when a product is to be carried out from of the cooling chamber 22. The packing style detector 26 detects a style of packing of a product carried thereto by the product carry-out automatic conveyor 3 and produces packing style data of the product.

The product carry-in automatic conveyor 2 successively carries products into the burn-in chamber 1 by way of the entrance 9, and the product carry-out automatic conveyor 3 successively carries out products from within the burn-in chamber 1 by way of the exit 10 and into the cooling chamber 22 by way of the entrance 23 of the cooling chamber 22.

With the burn-in apparatus, a product is carried into the burn-in chamber 1 by way of the entrance 9 by the product carry-in automatic conveyor 2. In this instance, the door of the entrance 9 is opened only when the product is to be carried in, but is closed after the product has been carried in. In this manner, several products are successively carried into the burn-in chamber 1. The products carried in the burn-in apparatus are tested while being burned in in the burn-in chamber 1.

The products for which burn-in has been completed in the burn-in chamber 1 are successively carried out from the burn-in chamber 1 by way of the exit 10 and then into the cooling chamber 22 by way of the packing style detector 25 and the entrance 23 of the cooling apparatus 21. In this instance, the packing style detector 26 detects packing style data of each product. The door of the exit 10 of the burn-in chamber 1 is opened only when each product is carried out, and is closed after completion of carrying out of the product.

The products successively carried into the cooling chamber 22 by the product carry-out automatic conveyor 3 are cooled to a room temperature. The products after being cooled to a normal temperature are successively carried out from the cooling chamber 22 by way of the exits 24 and 25.

In this manner, products are successively carried by the product carry-in automatic conveyor 2 by way of the entrance 9 into the burn-in chamber 1, in which they are subsequently dynamically burned in, and then they are successively carried out from the burn-in chamber 1 by way of the exit 10 by the product carry-out automatic conveyor 3 and into the cooling chamber 22 by way of the packing style detector 25 and the entrance 23 of the cooling apparatus 21, whereafter the products, for which dynamic burn-in has been completed, are successively taken out from the cooling chamber 22 by way of the exits 24 and 25.

Referring now to FIGS. 5 to 8, the burn-in apparatus 20 is shown more in detail. Again, the burn-in apparatus 20 includes the burn-in chamber 1 connected to the product carry-in automatic conveyor 2 and the product carry-out automatic conveyor 3. The product carry-in automatic conveyor 2 and the product carry-out conveyor 3 are such as those described above with reference to FIG. 4.

Also the burn-in apparatus 1 is such as that described above. More particularly, the burn-in chamber 1 is constructed such that it accommodates therein products to be burned in and maintains a temperature of air therein, which is conditioned by a plurality of, four in the embodiment shown, air conditioning units 7 to a temperature suitable for a product to be tested, to heat the products accommodated therein to effect burn-in of the products.

The burn-in chamber 1 includes such entrance 9 and exit 10 as described hereinabove with reference to FIG. 4.

Three testing equipments 4, four air conditioning units 7 and three connecting cables 11 are provided outside the burn-in chamber 1. While the quantities are different, they have substantially same functions as those of the conventional burn-in apparatus described hereinabove, and detailed description thereof is omitted herein to avoid redundancy.

A burn-in storage 5 and a rack master 8 which serves as product moving means are provided in the burn-in chamber 1.

The burn-in storage 5 is adapted to receive therein products carried thereto by the rack master 8 and supplies electric power to the products to energize them. The burn-in storage 5 includes a total of 21 racks 30 each adapted to receive two or three products thereon and each having three shelves (FIG. 11), the distance between which can be varied so as to cope with a plurality of products having different profiles from each other, and three buffer burn-in racks 33.

In particular, the burn-in storage 5 includes a row of twelve racks 30 and another row of nine racks 30 and three buffer burn-in racks 33 provided in an opposing relationship on the opposite sides of a passageway of the rack master 8. Consequently, the burn-in storage 5 includes a total of 72 shelves.

It is to be noted that each of the racks 30 can receive thereon two or three products of any of a plurality of various having different profiles from each other.

Figure 10:
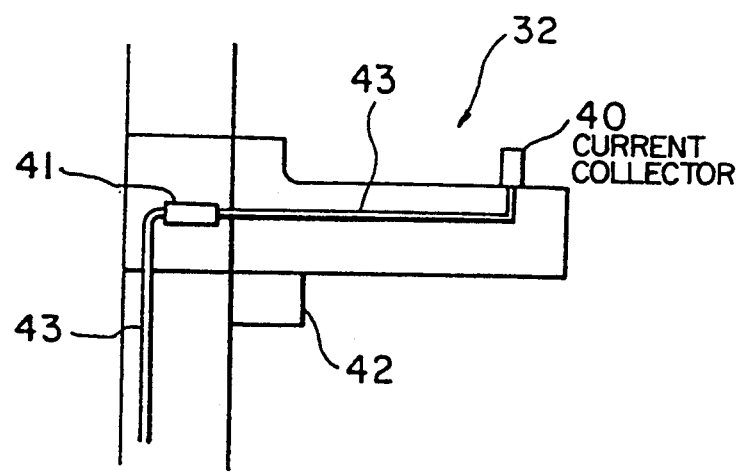
FIG. 10 is a diagrammatic view showing details of a rack of the burn-in apparatus of FIG. 4.
Figure 11:
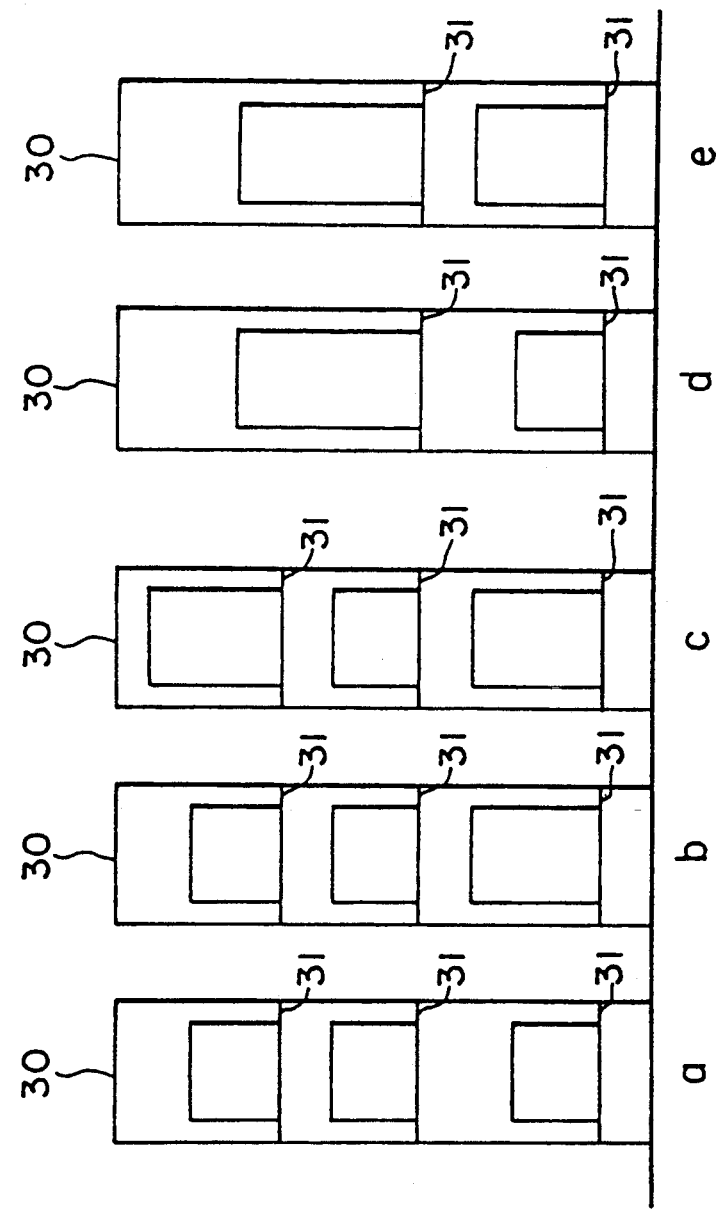
FIG. 11 is a diagrammatic view illustrating an arrangement of such racks.

Referring to FIGS. 10 and 11, each of the racks 30 includes three burn-in shelves 31 (refer to a, b and c of FIG. 11) and three corresponding feeder apparatus 32. The burn-in shelves 31 individually receive thereon products carried thereto by the rack master 8.

Each of the buffer burn-in racks 33 serves also as a product testing apparatus 6 and will be described in detail in the description of the product testing apparatus 6 given hereinbelow with reference to FIG. 9.

The burn-in shelves 31 is each removably mounted on the corresponding rack 30 such that they may be disposed also in such a pattern as shown at d and e of FIG. 11 so that the distance between adjacent ones of the burn-in shelves 31 may cope with any of a plurality of types of products having different profiles from each other.

Referring now to FIG. 10, each of the feeder apparatus 32 is provided on a truss of a corresponding one of the racks 30 and supplies electric power to a product placed on a corresponding one of the burn-in shelves 31 of the rack 30 to put the product into an energized condition. The feeder apparatus 32 includes a current collector 40, a connector 41, a fuse 42 and a feeder wire 43.

The current collector 40 is an end portion of a power line for supplying electric power to a product when a plug of a cable of the product is fitted in the current collector 40. The connector 41 is provided to disconnectably connect the feeder wire 43 thereto. The fuse 42 opens the electric circuit when an excessively high current flows therethrough.

If a product is placed onto a burn-in shelf 31 and the plug of the cable of the product is fitted into the current collector 40 which is the terminal end of the power line, then electric power is supplied to the product by way of the feeder wire 43 and the connector 41. Then, if an excessively high current should flow, the fuse 42 opens the electric circuit thereby to protect the product.

Since the feeder apparatus 32 is provided in this manner, when a product is placed on the burn-in shelf 31, the plug of the cable of the product will be fitted into the current collector 40 so that electric power may be provided to the product. Consequently, the product placed on the burn-in shelf 31 is energized while it remains in this condition.

In the burn-in apparatus 20 having such construction as described above, the burn-in shelves 31 are suitably removed or re-mounted from or onto the racks 30 so as to assure spacings of distances between the burn-in shelves 31 in which products are to be received, and products are placed onto the burn-in shelves 31 by the rack master 8. Then, the products placed on the burn-in shelves 31 are supplied with electric power by the feeder apparatus 32 so that they are put into an individually energized condition while they remain placed on the burn-in shelves 31. Then, if an excess current flows through any one of the products, then the corresponding feeder apparatus 32 stops the supply of power in order to protect the product.

Since the burn-in shelves 31 having distances which can be varied to cope-with a plurality of types of products having different profiles from each other and the corresponding feeder apparatus 32 are provided, each of the racks 30 can receive thereon a plurality of products of different types having different profiles from each other and having been carried thereto by the rack master 8 and supply electric power to the thus received products to energize them.

Further, in the burn-in apparatus 20 having such construction as described above, various products of various types having different profiles and having been carried by the rack master 8 are placed into the burn-in storage 5 by the rack master 8 and supplied with electric power so as to be put into an energized condition.

In this manner, since the racks 30 onto which the burn-in shelves 31 can be removably mounted and which are provided with the feeder apparatus 32 are provided, the burn-in storage 5 can place onto the burn-in shelves 31 products of a plurality of types having different profiles from each other and supply electric power to the products to put them into an energized condition.

Figure 12:
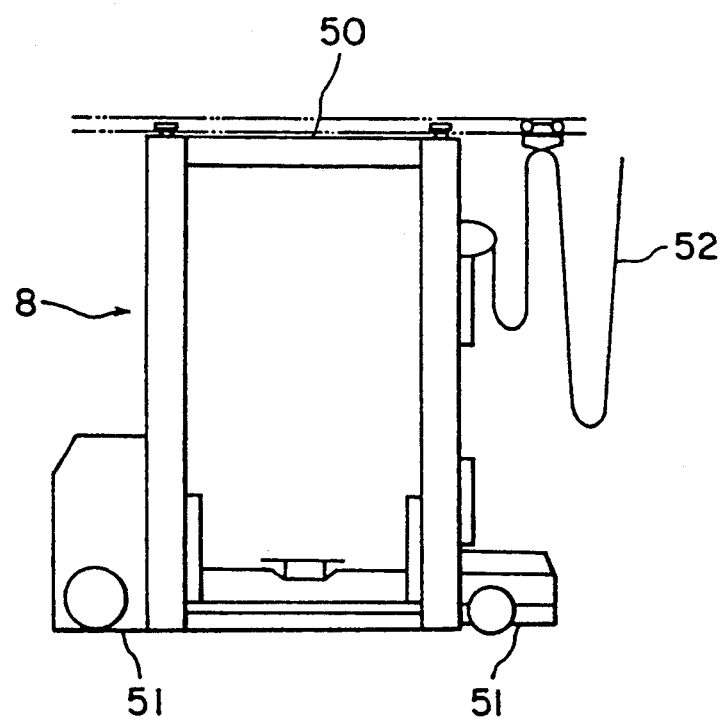
FIG. 12 is a schematic front elevational view showing a rack master of the burn-in apparatus of FIG. 4.

Referring to FIG. 12, the rack master 8 shown in FIGS. 5 to 8, which can carry products among the product carry-in automatic conveyor 2, the product carry-out automatic conveyor 3, the burn-in shelves 31 of the burn-in storage 5 and the product testing apparatus 6, includes a lift apparatus 50, a rack master moving apparatus 51 and a rack master connecting cable 52.

The lift apparatus 50 moves upwardly or downwardly and takes out a product from the product carry-in automatic conveyor 2, one of the burn-in shelves 31 in the burn-in storage 5 or any one of the product testing stations 6, moves the thus taken out product upwardly or downwardly and places or accommodates the product onto or into the product carry-out automatic conveyor 3, one of the burn-in shelves 31 in the burn-in storage 5 or one of the product testing sections 6.

The rack master moving apparatus 51 moves the rack master 8 along rails (not shown) of a transport passageway of the rack master 8 so that it can move the lift apparatus 50 to a position in front of the product carry-in automatic conveyor 2, the product carry-out automatic conveyor 3, one of the burn-in shelves 31 of the burn-in storage 5 or one of the product testing apparatus 6. The rack master connecting cable 52 communicates a controlling signal to the rack master 8.

Accordingly, when a product is to be moved, a controlling signal is provided to the rack master 8 by way of the rack master connecting cable 52. In response to the controlling signal, the rack master 8 operates in the following manner.

First, the rack master 8 is moved along the rails of the transport passageway to a position in front of an aimed product placed on the product carry-in automatic conveyor 2, a burn-in shelf 31 or a product testing apparatus 6.

Then, with the rack master 8 at the position, the lift apparatus 50 moves upwardly or downwardly and takes out the aimed product from the position at which the product is placed, that is, from the product carry-in automatic conveyor 2, the burn-in shelf 31 or the product testing apparatus 6.

Subsequently, the rack master 8 carrying the product thereon is moved by the rack master moving apparatus 51 to a position in front of an aimed component to which the product is to be moved, such as the product carry-out automatic conveyor 3, a burn-in shelf 31 or a product testing apparatus 6.

Then, the rack master 8 moves the product carried thereto upwardly or downwardly by means of the lifting apparatus 50 thereof in front of the component (i.e., the product carry-in automatic conveyor 3, the burn-in shelf 31 or the product testing apparatus 6) and places the product onto a predetermined location of the product carry-out automatic conveyor 30 the burn-in shelf 31 or the product testing apparatus 6.

In this manner, the rack master 8 can move (by means of the lifting apparatus 50, the rack master moving apparatus 51 and the rack master connecting cable 52 thereof) a product between the product carry-in automatic conveyor 2, the product carry-out automatic conveyor 3, a burn-in shelf 31 and a product testing apparatus 6.

By the way, as seen from FIGS. 5 to 8, each of the product testing sections 6 is provided such that it extends between the inside and the outside of the burn-in chamber 1 and tests a product using the testing equipment 4 while the product is being energized during burn-in.

Figure 9:
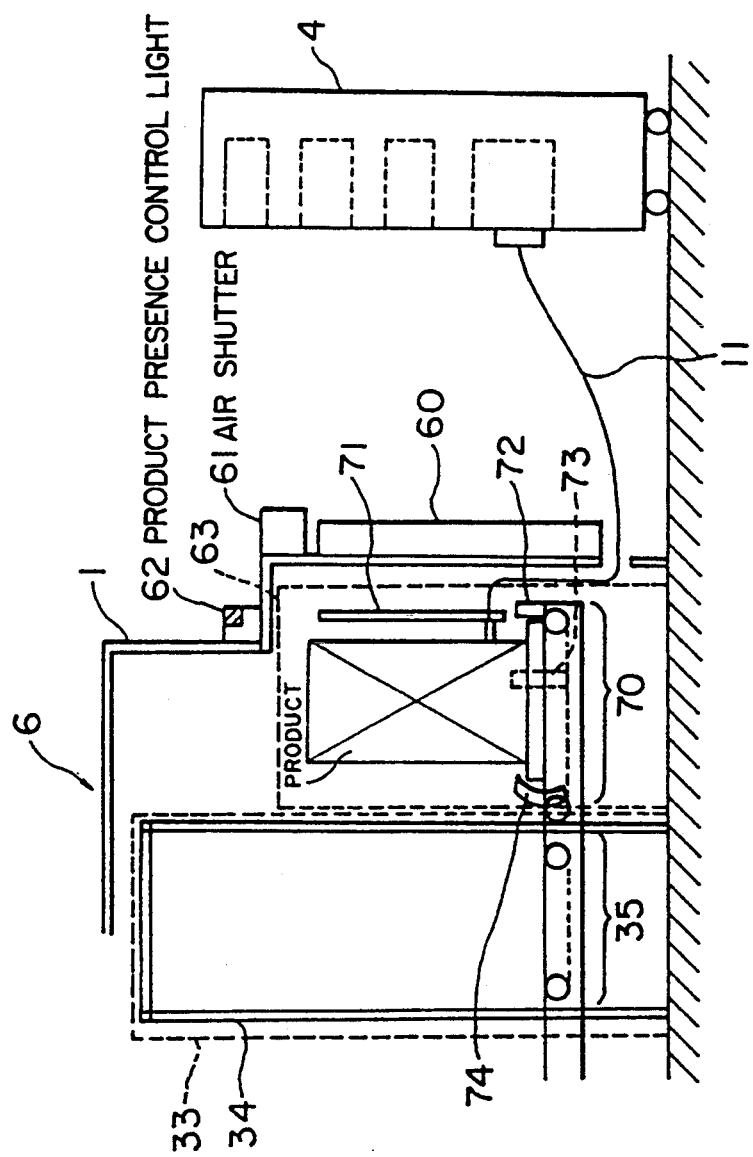
FIG. 9 is a diagrammatic view showing a product testing section of the burn-in apparatus of FIG. 4.

Referring to FIG. 9, each of the product testing sections 6 includes a glass closing window 60, an air shutter 61 and a product presence patrol light 62 all provided on an outer wall of the burn-in chamber 1 and further includes a buffer burn-in rack 34 and a dynamic burn-in shelf 63 both provided in the burn-in chamber 1.

The glass closing window 60 allows an operator to look into the product testing station 6 through the glass plate thereof to see whether or not a product is placed on the dynamic burn-in shelf 63 and in what condition the product is during burn-in. After a product is placed onto the dynamic burn-in shelf 63, the glass closing window 60 is opened and the connecting cable 11 of the product testing section 6 is connected to the product. After then, the glass closing window 60 is closed.

The air shutter 61 blows down hot air from above the glass closing window 60, which is open then, to make a wall of a warm wind so that, while a hand of an operator and the connecting cable 11 are allowed to be inserted into the burn-in chamber 1 from the outside so that a connecting operation of the connecting cable 11 may be performed, warm air in the burn-in chamber 1 is prevented from leaking out of the burn-in chamber 1.

The product presence patrol light 62 is lit when a product is placed on the dynamic burn-in shelf 63 to give a notification that a product is placed on the dynamic burn-in shelf 63. The product presence patrol light 62 may be lit to give a notification whether or not all wires of the connecting cable 11 are connected.

The buffer burn-in racks 33 are included in the burn-in storage 5 and each supplies electric power to a product carried thereto by the rack master 8 to put the product into an energized condition. The rack master 8 moves a product between a buffer burn-in rack 33 and a dynamic burn-in shelf 63. Further, when a product being tested is transported by a malfunction of the system or when products are carried in an overlapping relationship into the product testing apparatus 6, the buffer burn-in rack 33 protects the product or products from damage.

The buffer burn-in rack 33 is constituted from a rack 34 and a rack side conveyor 35. The rack 34 has a substantially same structure as the rack 30 of the burn-in storage 5 described hereinabove.

The rack side conveyor 35 moves a product between the buffer burn-in rack 33 and the dynamic burn-in shelf 63. Further, when a product being tested is transported by a malfunction of the system or when products are carried in an overlapping relationship into the product testing apparatus 6, the rack side conveyor 35 assures the product carried thereto by a malfunction in order to protect the product from otherwise possible damage.

With the buffer burn-in rack 33 having such construction as described above, a product which has been carried thereto by the rack master 8 is accommodated into the rack 34 and placed onto the burn-in shelf 31 in the rack 34 and supplied with electric power so that it is put into an energized condition by the feeder apparatus 32. When the product is to be dynamically burned in, it is moved to the dynamic burn-in shelf 63 by the rack side conveyor 35.

In case a product being tested is transported by a malfunction of the system of in case two products are carried in in an overlapping relationship into the product testing apparatus 6, the product having been transported by the malfunction is assured on the rack side conveyor 35 and protected from damage.

In this manner, with the buffer burn-in rack 33, a product having been moved by the rack master 8 is accommodated into the rack 34 and placed onto a burn-in shelf 31 in the rack 34, and then, the product is supplied and energized with electric power by the feeder apparatus 32. When the product in the rack 34 is to be dynamically burned in, the product is moved to the dynamic burn-in rack 63.

Further, in case a product being tested is transported by a malfunction of the system or in case two products are carried in in an overlapping relationship into the product testing section, the product having been transported by the malfunction is assured by the rack side conveyor 35 in order to protect the product from otherwise possible damage.

While the dynamic burn-in shelf 63 burns in a product transported thereto from the rack side conveyor 35, the product is tested by the testing equipment 4, and after then, the product is moved to the rack side conveyor 35.

The dynamic burn-in shelf 63 includes a chain conveyor 70, a cable detecting machine 71, an end rise stopper 72, a feeder apparatus 73 and a pallet holder 74.

The chain conveyor 70 moves a pallet, on which a product carried thereto from the buffer burn-in rack 33 is placed, to a position at which a corner thereof contacts with the end stopper 72. Further, a product on the chain conveyor 70 is tested while being burned in, and the product for which testing has been completed is subsequently transported to the buffer burn-in rack 33. Further, the chain conveyor 70 can be removed from the product testing apparatus 6, and an automatic cable connecting machine can be installed in place of the chain conveyor 70 in the future.

The cable detecting machine 71 checks, when a product is to be tested, whether or not all wires of the connecting cable 11 are connected completely, and further checks, before the product is transported to the buffer burn-in rack 33 after testing of the product is completed, whether or not all of the wires of the connecting cable 11 have been disconnected completely.

The end rise stopper 72 is abutted with a pallet transported thereto by the chain conveyor 70 to stop the pallet, on which a product is placed, at the position at which the pallet and the end rise stopper 72 contact with each other.

The feeder apparatus 73 supplies electric power to a product placed on a pallet carried thereto to put the product into an energized condition. The pallet holder 74 operates, in response to depression of a button (not shown) of an operation box (not shown) after a pallet and a product placed on the pallet are stopped at the position at which the pallet contacts with the end rise stepper 72, to hold down and fix the pallet there.

With the burn-in dynamic shelf 63 having such construction described above, a pallet carried thereto from the buffer burn-in rack 33 and having a product placed thereon is stopped at the position at which the pallet contacts with the end rise stopper 72. After then, when the button of the operation box is depressed by an operator, the pallet holder 74 operates to hold down and fix the pallet.

Then, the product placed on and carried by the pallet is supplied with electric power by the feeder apparatus 73 so that it is put into an energized condition. The connecting cable 11 is then manually connected to the product, and it is checked by the cable detecting machine 71 whether or not all of the wires of the connecting cable 11 are connected completely. Further, the product is tested by the testing equipment 4 by way of the connecting cable 11 while it is burned in.

After testing of the product is completed in this manner, all of the wires of the connecting cable 11 are disconnected from the product, and it is checked by the cable detecting machine 71 whether or not all of the wires of the connecting cable 11 have been disconnected completely. Then, after completion of testing of the product, the pallet on which the product is placed is moved to the buffer burn-in rack 33 by the chain conveyor 70. Further, when an automatic cable connecting machine is to be installed in the future, the chain conveyor 70 is removed from the product testing apparatus 6, and an automatic cable connecting machine is installed instead.

Testing of the product is performed by the testing equipment 4 while the product is burned in using the chain conveyor 70, the cable detecting machine 71, the end rise stopper 72, the feeder apparatus 73 and the pallet holder 74 in this manner, and after then, the product is moved to the rack side conveyor 35.

By the way, each of the product testing apparatus 6 having such construction as described above accommodates a product, which has been transported thereto from the rack master 8, into the buffer burn-in rack 33 thereof and supplies the product with electric power to energize the product. Then, the product is transported from the burn-in shelf 31 of the buffer burn-in rack 33 to the dynamic burn-in shelf 63 by the rack side conveyor 35.

After the product is transported to and placed onto the dynamic burn-in shelf 63, the product presence patrol light 62 is lit to notify it to an operator that a product has been placed onto the dynamic burn-in shelf 63. The product presence patrol light 62 may be used to notify whether or not all of the wires of the connecting cable 11 are connected completely.

Then, when the product presence patrol light 62 is lit, if an operator looks into the product testing apparatus 6 through the glass closing window 60, then it can be confirmed whether or not a product has been placed onto the dynamic burn-in shelf 63.

After it is confirmed that a product is placed on the dynamic burn-in shelf 63, the operator will open the glass closing window 60 and perform a connecting operation of the connecting cable 11 to the product.

In this instance, a wind is blown down from above the glass closing window 60 in an open condition by the air shutter 61 so that a wall of warm air is produced at the opening for the glass closing window 60, and the connecting cable 11 will be manually connected to the product through the wall of warm air. Consequently, warm air in the burn-in chamber 1 can be prevented sufficiently from leaking to the outside of the burn-in chamber 1.

Then, after those operations are completed, the class closing window 60 is closed, and the product having been transported to and placed onto the dynamic burn-in shelf 63 is burned in while testing is performed by the testing equipment 4. Further, in this instance, the state of the product being burned in may be observed through the glass of the glass closing window 60. Then, after completion of testing, the product is moved from the dynamic burn-in shelf 63 to the rack side conveyor 35.

In this manner, with the product testing apparatus 6, since the buffer burn-in rack 33 is provided forwardly of the dynamic burn-in shelf 63 and a product is placed fixedly on the dynamic burn-in shelf 63, the product can be tested using the testing equipment 4 while it is energized during burn-in, and further, even if a product being tested is transported by a malfunction of the system or products are carried in an overlapping relationship into the product testing apparatus 6, the product or products can be prevented from being damaged.

Referring back to FIGS. 5 to 8, with the burn-in apparatus shown and having such construction as described above, the temperature of air in the burn-in chamber 1 is adjusted by the air conditioning units 7 to a temperature suitable for a product to be tested.

Then, a product is carried into the burn-in chamber 1 through the entrance 9 by the product carry-in automatic conveyor 2, and in this instance, the door of the entrance 9 is opened only when the product is carried in. After the product is carried in, the door is closed. Several products are carried into the burn-in chamber 1 in a similar manner.

The products carried in the burn-in chamber 1 are then stored and heated in the burn-in chamber 1. Further, the products are successively moved to the burn-in shelves 31 of the racks 30 in the burn-in storage 5 by the rack master 8.

The products successively moved to the burn-in shelves 31 of the racks 30 in the burn-in storage 5 are held in the burn-in storage 5 and supplied and energized with electric power so that they are burned in.

After then, the products being burned in in the burn-in storage 5 are successively moved from the burn-in shelf 31 of the rack 30 of the burn-in storage 5 to the product testing apparatus 6 by the rack master 8.

Each of the products successively moved to the product testing apparatus 6 is energized and burned in by the product testing apparatus 6 while it is tested by the testing equipment 4 by way of the connecting cable 11. The product for which testing by the product testing apparatus 6 has been completed is moved to the product carry-out automatic conveyor 3 by the rack master 8. The product moved to the product carry-out automatic conveyor 3 is then carried to the cooling apparatus 21 shown in FIG. 4 by the product carry-out automatic conveyor 3.

The present burn-in apparatus is constructed such that the testing equipment 4 and the air conditioning units 7 for adjusting the temperature in the burn-in chamber 1 are provided outside the burn-in chamber 1. The burn-in charmer 1 is connected to the product carry-in automatic conveyor 2, the product carry-out automatic conveyor 3. The product testing equipments 6 which test products using the testing equipment 4 while energizing the products during burn-in, are each provided such that it extends between the inside and the outside of the burn-in chamber 1. The burn-in storage 5 for receiving products therein while energizing them and the rack master 8, which can move a product among the product carry-in automatic conveyor 2, the product carry-out automatic conveyor 3, the burn-in storage 5 and the product testing apparatus 6, are provided in the inside of the burn-in chamber 1 as described above. Therefore a large number of products of different types can be burned in at a time by means of the single burn-in chamber 1, the small number of air conditioning units 7 and the testing equipment 6. Consequently, the burn-in apparatus can be provided at a low cost of equipment comparing with an individual burn-in apparatus.

For example, if a case is considered wherein a total of 72 products are dynamically burned in for a day, the required cost of equipment for the present burn-in apparatus is only almost one seventh the cost of equipment for a conventional individual burn-in apparatus.

Besides, similarly as an individual burn-in apparatus, the present burn-in apparatus can check many products during burn-in by means of the testing equipment to see whether or not the products have some defects, and can find defective products which have failed completely during burning in and defective products which operate unstably and suffer from failures only during burning in (making a factor of an initial failure after delivery to a customer). In short, the present burn-in apparatus have only advantages of the conventional burn-in apparatus of the three different types described hereinabove.

Further, since the buffer burn-in rack is provided forwardly of the dynamic burn-in shelf, even if a product being tested is transported by a malfunction of the system or products are carried in an overlapping relationship into the product testing apparatus 6, the product or products will not be damaged.

Figure 13:
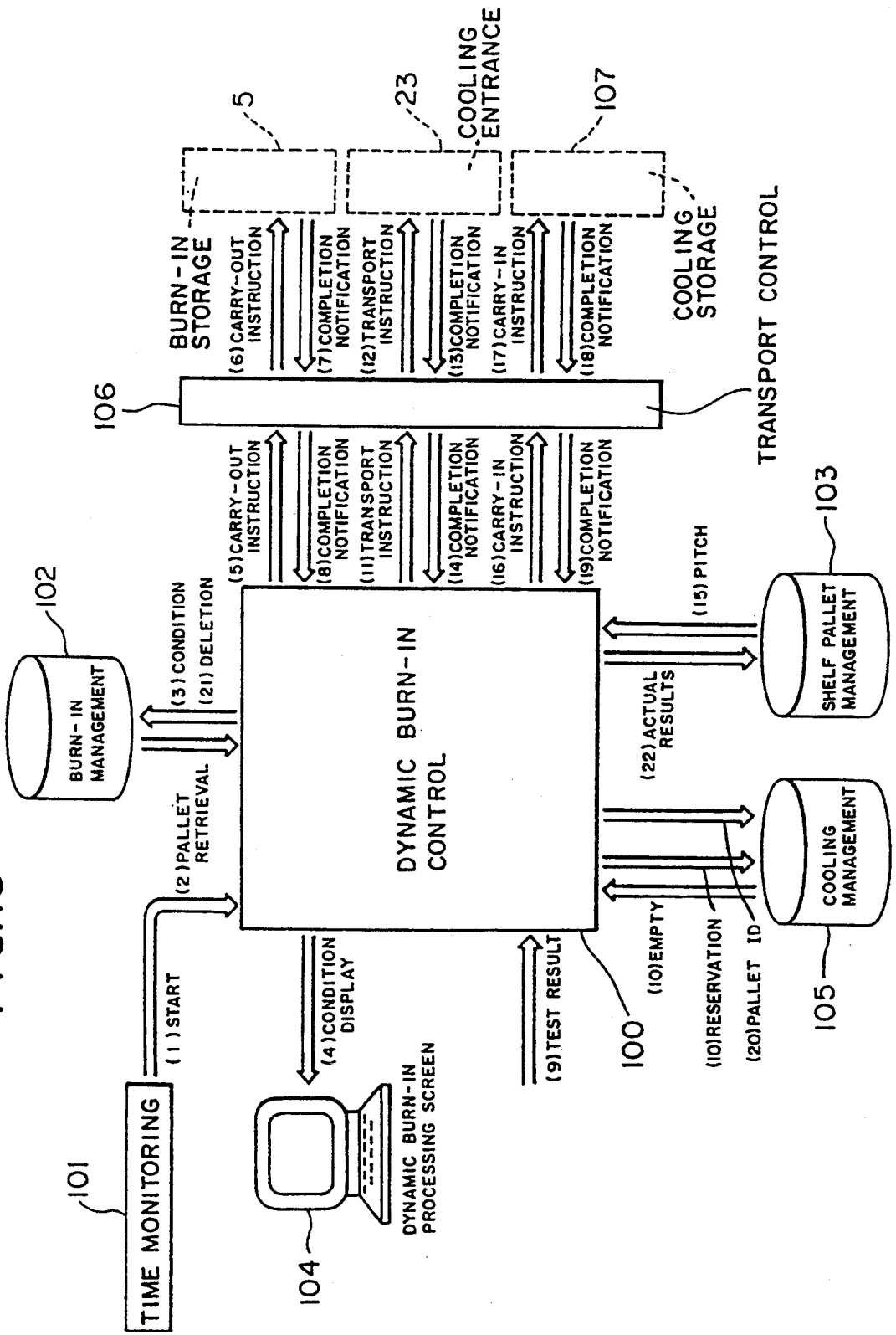
FIG. 13 is a block diagram showing a controlling system of the burn-in apparatus of FIG. 4.

FIG. 13 is a block diagram showing a controlling system for the burn-in apparatus described above. Referring to FIG. 13, the dynamic burn-in system shown includes a dynamic burn-in controlling apparatus 100, a time monitoring apparatus 101, a burn-in management file 102, a shelf-pallet management file 103, a dynamic burn-in processing screen section 104, a cooling management file 105 and a transport controlling apparatus 106.

The dynamic burn-in controlling apparatus 100 reads the burn-in management file 102 and checks, if one of the dynamic burn-in shelves 63 is empty, i.e., has no product placed thereon, whether or not there is a pallet with a product placed thereon which can be or is ready to be transported from a burn-in shelf 31 of the burn-in storage 5. However, if none of the dynamic burn-in shelves 63 is empty, then the dynamic burn-in controlling apparatus 100 ends its processing.

It is to be noted that the conditions for permitting transportation of a pallet from a burn-in shelves 31 to a dynamic burn-in shelf 63 are such as follows:
(1) The pallet has placed thereon a product to be subject to dynamic burn-in testing, and the product has not been tested as yet.
(2) Either it is within a dynamic burn-in time period of the shelf pallet management file 103 after a scheduled burn-in carry-out point of time, or the scheduled burn-in carry-out point of time has elapsed.

Further, when there is a pallet on which an applicable product is placed, in order to transport the product from the burn-in shelf 31 on which the pallet is placed to the empty dynamic burn-in shelf 63, the dynamic burn-in controlling apparatus 100 delivers an instruction to the transport controlling apparatus 106 to carry out the pallet from the burn-in storage 5 together with the addresses of the two shelves. After then, the dynamic burn-in controlling apparatus 100 can receive a completion notification from the transport controlling apparatus 106.

Furthermore, the dynamic burn-in controlling apparatus 100 can Write, after the pallet on which the product is placed is transported to the destination product testing apparatus 6, a condition of the pallet at the product testing apparatus 6 into the burn-in management file 102.

Also the dynamic burn-in controlling apparatus 100 can provide, when the determination based on the testing of the product by the product testing apparatus 6 is "rejection", an instruction to the transport controlling apparatus 106 to transport the product as a rejected article to a predetermined location. Further, when a result Of testing of the product at the product testing apparatus 6 is inputted to the dynamic burn-in controlling apparatus 100 by way of, for example, a keyboard of the dynamic burn-in processing screen section 104, then the dynamic burn-in controlling apparatus 100 can research an empty condition of the cooling management file 105 to research whether OF not a product can be transported from a dynamic burn-in shelf 63 to the cooling entrance 23. In this instance, if a product can be transported, then the dynamic burn-in controlling apparatus 100 reserves a rack address of a destination of the product in the cooling management file 105 and delivers a transporting instruction to transport the product to the transport controlling apparatus 106. On the contrary, if there is no empty place in a cooling storage 107, which is the cooling apparatus 21 shown in FIG. 4, then the dynamic burn-in controlling apparatus 100 delivers an instruction to continue burn-in.

Besides, the dynamic burn-in controlling apparatus 100 may receive a transport completion notification from the transport controlling apparatus 106 together with packing style data from the packing style detector 26 at the cooling entrance 23, and then read a pitch from the shelf-pallet management file 103 and compare the pitch and the packing style data with each other. Then, if the pitch and the packing style data do not coincide with each other, then the dynamic burn-in controlling apparatus 100 determines the product as an article to be thrown in again. On the other hand, if the pitch and the packing style data coincide with each other and there is an empty space in the cooling storage 107, then the dynamic burn-in controlling apparatus 100 can deliver to the transport controlling apparatus 106 an instruction to transport a product from the dynamic burn-in shelf 53 to the cooling storage 107.

In addition, when carrying into the cooling storage 107 is completed, the dynamic burn-in controlling apparatus 100 receives from the transport controlling apparatus 106 a carry-in completion notification received from the cooling storage 107, and then calculates a scheduled cooling storage carry-out point of time at which the product should be carried out from the cooling storage 107. Then, the dynamic burn-in controlling apparatus 100 writes a pallet ID (identification number), a cooling time, the scheduled carry-out point of time, the pitch, a rack type, a shelf ID and a management number of the product into the cooling management file 105 and deletes pallet information of the burn-in management file 102 to put the file address into an empty condition. Then, when the product placed on the pallet is to begin to be cooled after completion of dynamic burn-in, the dynamic burn-in controlling apparatus 100 can write a condition of the product placed on the pallet into the shelf-pallet management file 103.

The time monitoring apparatus 101 monitors the time so that it starts the dynamic burn-in controlling apparatus 100 after each predetermined interval of time.

The burn-in management file 102 stores therein presence or absence of an empty one of the dynamic burn-in shelves 63 at present and conditions of products, which have been transported to the burn-in storage 5, in the burn-in storage 5. Such presence or absence information and condition information are written into, deleted from or read out from the burn-in management file 102.

In particular, the conditions in the burn-in storage 5 include a condition wherein a dynamic burn-in shelf 63 is empty and another condition wherein transportation of a product placed on a pallet from a burn-in shelf 31 to a dynamic burn-in shelf 63 is completed but testing of the product is not performed as yet. The conditions in the burn-in storage also include a further condition wherein connection of a connecting cable 11 to a product transported to a dynamic burn-in shelf 63 and confirmation of interlocking of the glass closing window 60 of the dynamic burn-in shelf 63 are confirmed and testing of the product is being performed. A still further condition exists wherein a connecting cable 11 is removed from a product placed on a dynamic burn-in shelf 63 and interlocking of the glass closing window 60 is confirmed and besides inputting of results of the testing is completed.

The shelf-pallet management file 103 stores pitches therein. Such pitches are written into, deleted from or read out from the shelf-pallet management file 103 by the dynamic burn-in controlling apparatus 100.

The dynamic burn-in processing screen section 104 retrieves, when the screen of "dynamic burn-in processing" is selected or an execution key (not shown) is depressed, the burn-in management file 102 and displays a latest condition on the screen. Further, the dynamic burn-in processing screen section 104 inputs therethrough results of testing of a product, for which testing has completed, into the dynamic burn-in controlling apparatus 100.

The cooling management file 105 stores therein a pallet ID, a cooling time, a scheduled carry-out point of time, a pitch, a rack type, a shelf ID and a management number of each product. Such information is written into, deleted from and read out from the cooling management file 105 by the dynamic burn-in controlling apparatus 100.

The transport controlling apparatus 106 receives, when a product placed on a pallet is to be transported from a burn-in shelf to a dynamic burn-in shelf 63, from the dynamic burn-in controlling apparatus 100 an instruction to carry out the product from the burn-in storage 5 together with rack addresses of the two locations. The transport controlling apparatus 106 thus transmits a carry-out instruction to the burn-in storage 5. Further, the transport controlling apparatus 106 receives a completion notification from the burn-in storage 5 and then transmits the completion notification to the dynamic burn-in controlling apparatus 100.

Further, the transport controlling apparatus 106 transmits, when a transport instruction to transport a product from a dynamic burn-in shelf 63 to the cooling entrance 23 is received from the dynamic burn-in controlling apparatus 100, the transport instruction to the cooling entrance 23.

Furthermore, the transport controlling apparatus 106 receives a transport completion notification from the cooling entrance 23 together with packing style data from the packing style detector 26 at the cooling entrance 23, and transmits the transport completion notification and the packing style data to the dynamic burn-in controlling apparatus 100.

Besides, the transport controlling apparatus 106 receives from the dynamic burn-in controlling apparatus 100, if a pitch read out from the shelf-pallet management file 103 and packing style data coincide with each other and there is an empty space in the cooling storage 107, an instruction to transport a product from the dynamic burn-in shelf 63 to the cooling storage 107, and after then, it transmits the transport instruction and a cooling carry-in instruction to the cooling storage 107. Then, after carrying of the product into the cooling storage 107 is completed, the transport controlling apparatus 106 receives a carry-in completion notification from the cooling storage 107 and delivers a notification of completion of carrying in to the dynamic burn-in controlling apparatus 100. The cooling storage 107 stores therein the product transported thereto and cools the product to a room temperature.

With the dynamic burn-in system having such construction as described above, first the dynamic burn-in controlling apparatus 100 is started after each predetermined interval of time by the time monitoring apparatus 101 ((1) of FIG. 13).

The dynamic burn-in controlling apparatus 100 thus started reads the burn-in management file 102 and checks, if there is an empty one among the dynamic burn-in shelves 63, whether or not there is a pallet which is ready to be transmitted from a burn-in rack 31 of the burn-in storage 5 ((2) of FIG. 13). It is to be noted that, in case there is no applicable pallet, the dynamic burn-in controlling apparatus 100 ends its processing.

Further, if there is a change in condition of a product in the burn-in storage 5, then the dynamic burn-in controlling apparatus 100 writes such change into the burn-in management file 102 ((3) of FIG. 13).

Then, the dynamic burn-in processing screen section 104 retrieves, when the "dynamic burn-in processing" screen is selected or the execution key is depressed, the burn-in management file 102 and displays a latest condition on the screen thereof to inform an operator who operates the dynamic burn-in system ((4) of FIG. 13).

In case there is a pallet on which an applicable product is placed, the dynamic burn-in controlling apparatus 100 transmits to the transport controlling apparatus 106, in order to transport the pallet from the burn-in shelf 31 to a dynamic burn-in shelf 63, an instruction to carry out the pallet from the burn-in storage 5 together with shelf addresses of them ((5) of FIG. 13).

Then, the transport controlling apparatus 106 having received the carry-out instruction transmits the carry-out instruction to the burn-in storage 5, and consequently, the burn-in storage 5 carries out the pallet, on which the applicable product is placed, from the burn-in shelf 31 to the dynamic burn-in shelf 63. After then, the transport controlling apparatus 106 receives a completion notification from the burn-in storage 5 and transmits the completion notification to the dynamic burn-in controlling apparatus 100 ((6) to (8) of FIG. 13).

Then, after testing of a product on one of the dynamic burn-in shelves 63 is completed, results of the testing of the product will be manually inputted to the dynamic burn-in controlling apparatus 100 from the screen of the dynamic burn-in processing screen section 104 ((9) of FIG. 13).

After the results of the testing of the product at the product testing apparatus 6 are inputted from the screen of the dynamic burn-in processing screen 104, the dynamic burn-in controlling apparatus 100 checks an empty condition of the cooling management file 105 and determines whether or not the product can be transported from the burn-in storage 5 to the cooling storage 107. If the product can be transported from the burn-in storage 5 to the cooling storage 107, then the dynamic burn-in controlling apparatus 100 reserves a shelf address of a destination of transportation of the product in the cooling management file 105. On the contrary if there is no empty place in the cooling storage 107, the dynamic burn-in controlling apparatus 100 delivers an instruction to continue the burn-in operation ((10) of FIG. 13).

After the dynamic burn-in controlling apparatus 100 reserves a shelf address of a destination of transportation in the cooling management file 105, it delivers to the transport controlling apparatus 106 an instruction to transport the product from the dynamic burn-in shelf 63 to the cooling entrance 105 ((11) of FIG. 13).

The transport controlling apparatus 106, which has received the transport instruction to transport the product from the dynamic burn-in shelf 63 to the cooling entrance 105, transmits the transport instruction to the cooling entrance 105 ((12) of FIG. 13).

After receiving the instruction to transport a product from the dynamic burn-in shelf 63 to the cooling entrance 105, the cooling entrance 105 transmits a transport completion notification to the transport controlling apparatus 106 together with packing style data from the packing style detector 26 at the cooling entrance 105 ((13) of FIG. 13). Then, the transport controlling apparatus 106 having received the transport completion notification together with the packing style data transmits the transport completion notification to the dynamic burn-in controlling apparatus 100 ((14) of FIG. 13).

The dynamic burn-in controlling apparatus 100 having received the transport completion notification together with the packing style data reads in a pitch from the shelf-pallet management file 103 and compares the pitch with the packing style data. If the pitch and the packing style data do not coincide with each other, then the dynamic burn-in controlling apparatus 100 determines the product as an article to be thrown in again ((15) of FIG. 13). On the other hand, if the pitch and the packing style data coincide with each other and there is an empty place in the cooling storage 1070 then the dynamic burn-in controlling apparatus 100 delivers to the transport controlling apparatus 106 an instruction to transport the product from the dynamic burn-in shelf 63 to the cooling storage 107 ((16) of FIG. 13).

The transport controlling apparatus 106, having received the instruction of transportation from the dynamic burn-in shelf 63 to the cooling storage 107, transmits the transportation instruction to the cooling storage 107 ((17) of FIG. 13).

The cooling storage 107, having received the transportation instruction, carries out the product for which testing has completed from the dynamic burn-in shelf 63 into the cooling storage 107 by way of the cooling entrance 105 and then transmits a carry-in completion notification to the transport controlling apparatus 106 ((18) of FIG. 13).

The transport controlling apparatus 106, having received the notification of completion of carrying in from the dynamic burn-in shelf 63 to the cooling storage 107, transmits the carry-in completion notification to the dynamic burn-in controlling apparatus 100 ((19) of FIG. 13).

The dynamic burn-in controlling apparatus 100, having received the carry-in completion notification, writes a pallet ID, a cooling time, a scheduled carry-out point of time a pitch, a rack type, a shelf ID and a management number of the product into the cooling management file 105 ((20) of FIG. 13) and deletes information of the product placed on the pallet for which testing has completed and which has been carried into the cooling storage 107 from the burn-in management file 102 to put the area of the burn-in management file 102 into a blank condition ((21) of FIG. 13).

Further, the dynamic burn-in controlling apparatus 100 writes a condition of the product placed on the pallet, which has been carried into and cooled in the cooling storage 107, into the shelf-pallet management file 103 ((22) of FIG. 13).

In this manner, the time monitoring apparatus 101, burn-in management file 102, shelf-pallet management file 103, dynamic burn-in processing screen section 104, cooling management file 105, transport controlling apparatus 106 and cooling storage 107 are controlled by the dynamic burn-in controlling apparatus 100 and the transport controlling apparatus 106 to perform dynamic burn-in of various products.

Then, results of testing of the products by burn-in will be inputted to the dynamic burn-in controlling apparatus 100 by way of the dynamic burn-in processing screen section 104.

The present invention is not limited to the specifically described embodiment, and variations and modifications may be made without departing from the scope of the present invention.

What is claimed is:

1. A burn-in apparatus, comprising:
    a burn-in chamber which burns in a product placed therein;
    a product carry-in automatic conveyer which is operatively connected to said burn-in chamber and carries products into said burn-in chamber;
    a product carry-out automatic conveyor which is operatively connected to said burn-in chamber and carries products out of said burn-in chamber;
    an air conditioning unit, coupled to, and provided outside said burn-in chamber, which adjusts the temperature of air inside said burn-in chamber;
    a product testing section, extending between the outside and the inside of said burn-in chamber, which holds and provides electrical power to a product during burn in;
    testing equipment which is provided outside said burn-in chamber and connects to a product held by said product testing section so that the product can be tested during burn in while the product is held by said product testing section;

a burn-in storage, provided inside said burn-in chamber, which receives a product and provides electrical power thereto until the product is to be tested; and product moving means for transporting a product to be tested from the burn-in storage to the product testing section and for automatically moving a product among said product carry-in automatic conveyor, said product carry-out automatic conveyor, said burn-in storage and said product testing section.

2. A burn-in apparatus as claimed in claim 1, wherein said burn-in storage comprises:

a plurality of racks each having a plurality of burn-in shelves; and a plurality of feeder apparatuses which correspond, respectively, to the plurality of burn-in shelves.

3. A burn-in apparatus as claimed in claim 2, wherein said burn-in shelves of each of said racks are removably mounted on the rack so that the rack can receive a plurality of types of products having different profiles from each other.

4. A burn-in apparatus as claimed in claim 1, wherein said product moving means comprises:

a lift apparatus movable upward and downward to remove a product from one of said product carry-in automatic conveyor, said burn-in storage and said product testing section, move the removed product upward or downward to position the product in alignment with a respective one of said product carry-out automatic conveyor, said burn-in storage and said product testing section, and provide the product from the aligned position to the respectively aligned one of said product carry-out automatic conveyor, said burn-in storage and said product testing section; and a moving apparatus which moves said lift apparatus to each of said product carry-in automatic conveyor, said product carry-out automatic conveyor, said burn-in storage and said product testing section.

5. A burn-in apparatus as claimed in claim 1, wherein said product testing section comprises:

a window that can open and close, mounted on said burn-in chamber, which allows a product inside said burn-in chamber to be visually observed therethrough;

an air shutter, mounted on said burn-in chamber, which blows down a hot wind from above said window when said window is open so as to make a wall of warm air which prevents air inside said burn-in chamber from leaking out of said burn-in chamber;

a dynamic burn-in shelf, provided inside said burn-in chamber, which receives a product to be tested;

a buffer burn-in rack, provided inside said burn-in chamber, which temporarily accommodates a product to be tested; and a rack side conveyor which moves a product between said dynamic burn-in shelf and said buffer burn-in rack.

6. A burn-in apparatus as claimed in claim 5, further comprising a cable which connects said testing equipment to a product inside said burn-in chamber, wherein said dynamic burn-in shelf comprises:

a cable detector which detects connection or disconnection of the cable to said testing equipment;

a stopper for stopping, at a fixed position, a product carried thereto by said rack side conveyor; and a feeder apparatus which provides electrical power to a product on said dynamic burn-in shelf.

7. A burn-in apparatus as claimed in claim 6, wherein said dynamic burn-in shelf further comprises a chain conveyor which cooperates with said rack side conveyor to move a product.

8. A burn-in apparatus as claimed in claim 7, wherein said chain conveyor is removably coupled to said dynamic burn-in shelf.

9. A burn-in apparatus as claimed in claim 6, wherein a product is placed on a pallet and, to stop the product at the fixed position, said stopper contacts the pallet.

10. A burn-in apparatus as claimed in claim 9, wherein said dynamic burn-in shelf further comprises a pallet holder manually operable for holding down and fixing a pallet after the pallet is stopped by said stopper.

11. A burn-in apparatus as claimed in claim 5, wherein said product testing section further comprises a product presence patrol indicator provided outside said burn-in chamber which indicates that a product is present in said product testing section.

12. A burn-in apparatus as claimed in claim 1, wherein said product testing section includes at least one testing position where a respective product is tested, the burn-in apparatus further comprising burn-in controlling means for detecting an empty testing position in said product testing section, determining whether or not there is a product which can be carried out from said burn-in storage and executing, when such product exists, processing necessary for testing of the product, and ending processing of products to be carried out from said burn-in storage when there is not a product which can be carried out from said burn-in storage.

13. A burn-in apparatus as claimed in claim 12, wherein said burn-in controlling means includes product moving controlling means for moving a product.

14. A burn-in apparatus as claimed in claim 13, wherein said product moving controlling means allows a product to be carried out from said burn-in storage within a fixed duration after a scheduled time at which the product is to be carried out from said burn-in storage or after such scheduled time has passed.

15. A burn-in apparatus as claimed in claim 1, wherein said burn-in chamber has an entrance having a door which permits a product to be carried into said burn-in chamber by said product carry-in automatic conveyor, and an exit having a door which permits a product to be carried out from said burn-in chamber by said product carry-out automatic conveyor.

16. A burn-in apparatus as claimed in claim 15, wherein each product has a corresponding packing style, said burn-in apparatus further comprising a packing style detector which detects the presence of a product being carried out of said burn-in chamber by said product carry-out conveyor and the corresponding packing style of the respective product, said door of said entrance being opened when said packing style detector detects the presence of a product.

17. A burn-in apparatus, comprising:

a burn-in chamber which burns in a product placed therein by heating air inside said burn-in chamber;

a product carry-in automatic conveyer which is operatively connected to said burn-in chamber and carries products into said burn-in chamber;

a product carry-out automatic conveyor which is operatively connected to said burn-in chamber and carries products out of said burn-in chamber;

an air conditioning unit which is coupled to, and provided outside, said burn-in chamber and adjusts the temperature of air inside said burn-in chamber;

a product testing section, extending between the outside and the inside of said burn-in chamber, which holds and provides electrical power to a product during burn-in, said product testing section comprises:
- a window that can open and close, mounted on said burn-in chamber, which allows a product inside said burn-in chamber to be visually observed therethrough,
- an air shutter, mounted on said burn-in chamber, which blows down a hot wind from above said window when said window is open so as to make a wall of warm air which prevents air inside said burn-in chamber from leaking out of said burn-in chamber,
- a dynamic burn-in shelf, provided inside said burn-in chamber, which receives a product to be tested,
- a buffer burn-in rack, provided inside said burn-in chamber, which temporarily accommodates a product to be tested, and
- a rack side conveyor which moves a product between said dynamic burn-in shelf and said buffer burn-in rack; and testing equipment which is provided outside said burn-in chamber and connects to a product held inside said product testing section so that the product can be tested by the testing equipment during burn in while the product is held by said product testing section.

18. A burn-in apparatus as claimed in claim 17, further comprising a cable for connecting said testing equipment to a product inside said burn-in chamber, wherein said dynamic burn-in shelf comprises:
- a cable detector for detecting connection or disconnection of said cable to said testing equipment;
- a stopper for stopping, at a fixed position, a product carried thereto by said rack side conveyor; and
- a feed apparatus for providing electrical power to a product on said dynamic burn-in shelf.

19. A burn-in apparatus as claimed in claim 18, wherein said dynamic burn-in shelf further comprises a chain conveyor for cooperating with said rack side conveyor to move a product.

20. A burn-in apparatus as claimed in claim 19, wherein said chain conveyor is removably coupled to said dynamic burn-in shelf.

21. A burn-in apparatus as claimed in claim 18, wherein a product is placed on a pallet and, to stop the product at a fixed position, said stopper contacts the pallet.

22. A burn-in apparatus as claimed in claim 21, wherein said dynamic burn-in shelf further comprises a pallet holder manually operable for holding down and fixing a pallet after the pallet is stopped by said stopper.

23. A burn-in apparatus as claimed in claim 17, wherein said product testing section further comprises a product presence patrol indicator provided outside said burn-in chamber which indicates the presence of a product in said product testing section.

24. A burn-in apparatus as in claim 17, further comprising:
- a burn-in storage, provided in said burn-in chamber, which receives a product and provides electrical power thereto;
- product moving means for moving a product among said product carry-in automatic conveyor, said product carry-out automatic conveyor, said burn-in storage and said product testing section.

25. A burn-in apparatus as in claim 24, wherein said burn-in storage comprises:
- a plurality of racks each having a corresponding plurality of burn-in shelves; and
- a plurality of feeder apparatuses corresponding, respectively, to the plurality of burn-in shelves.

26. A burn-in apparatus as in claim 25, wherein said plurality of burn-in shelves of each corresponding rack are removably mounted on the corresponding rack so that said rack can receive a plurality of types of products.

27. A burn-in apparatus as in claim 24, wherein said product moving means includes:
- a lift apparatus movable upwardly or downwardly to remove a product from one of said product carry-in automatic conveyor, said burn-in storage and said product testing section, move the removed product upwardly or downwardly to align the product in a position with one of said product carry-out automatic conveyor, said burn-in storage and said product testing section, and provide the product from the aligned position to the respectively aligned one of said product carry-out automatic conveyor, said burn-in storage and said product testing section; and
- a moving apparatus for moving said lift apparatus to each of said product carry-in automatic conveyor, said product carry-out automatic conveyor, said burn-in storage and said product testing section.

28. A burn-in apparatus as in claim 24, wherein said product testing section includes at least one position at which a respective product is tested, the burn-in apparatus further comprising a burn-in controlling means for detecting an empty testing position in said product testing section, determining whether or not there is a product which can be carried out from said burn-in storage and executing, when such product exists, processing necessary for testing of the product, and ending processing in regard to products to be carried out from said burn-in storage when there is not a product which can be carried out from said burn-in storage.

29. A burn-in apparatus as in claim 28, wherein said burn-in controlling means includes a product moving controlling means for moving a product.

30. A burn in apparatus as in claim 29, wherein said product moving controlling means allows a product to be carried out from said burn-in storage within a fixed duration after a scheduled time at which the product is to be carried out from said burn-in storage or after such scheduled time has passed.

31. A burn-in apparatus as in claim 17, wherein said burn-in chamber has an entrance having a door which permits a product to be carried into said burn-in chamber by said product carry-in automatic conveyor, and an exit having a door which permits a product to be carried out from said burn-in chamber by said product carry-out automatic conveyor.

32. A burn-in apparatus as claimed in claim 31, wherein each product has a corresponding packing style, said burn-in apparatus further comprising a packing style detector which detects the corresponding packing style of each product carried out from said burn-in chamber by said product carry-out conveyor.

* * * * *

UNITED STATES PATENT AND TRADEMARK OFFICE
CERTIFICATE OF CORRECTION

PATENT NO. : 5,397,998
DATED : March 14, 1995
INVENTOR(S) : Shigeru SOENO, et al.

It is certified that error appears in the above-indentified patent and that said Letters Patent is hereby corrected as shown below:

Col. 1, line 32, after "are", insert a comma (",").

Col. 4, line 59, delete "the" and insert therefor --a--.

Col. 13, line 5, delete "30" and insert therefor --3,--.

Col. 16, line 66, delete "charmer" and insert therefor --chamber--.

Col. 17, line 4, after "6", insert a comma (","); Line 11, after "Therefore", insert a comma (",").

Col. 18, line 13, delete "Write" and insert therefor --write--; Line 30, delete "Of" and insert therefor --of--.

Col. 21, line 59, delete "1070" and insert therefor --107,--.

Signed and Sealed this

Twenty-seventh Day of June, 1995

Attest:

BRUCE LEHMAN

Attesting Officer

Commissioner of Patents and Trademarks